United States Patent
Terado et al.

(10) Patent No.: US 11,798,869 B2
(45) Date of Patent: Oct. 24, 2023

(54) SEMICONDUCTOR PACKAGE WITH PLURALITY OF GROOVES ON LOWER SURFACE

(71) Applicant: Mitsubishi Electric Corporation, Tokyo (JP)

(72) Inventors: Yuki Terado, Tokyo (JP); Shiori Uota, Tokyo (JP); Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 155 days.

(21) Appl. No.: 17/403,135

(22) Filed: Aug. 16, 2021

(65) Prior Publication Data
US 2022/0278029 A1    Sep. 1, 2022

(30) Foreign Application Priority Data

Feb. 26, 2021  (JP) .................................. 2021-030287

(51) Int. Cl.
*H01L 23/495* (2006.01)
*H01L 23/31* (2006.01)
*H01L 23/00* (2006.01)

(52) U.S. Cl.
CPC .... *H01L 23/49568* (2013.01); *H01L 23/3107* (2013.01); *H01L 23/4952* (2013.01); *H01L 23/49503* (2013.01); *H01L 23/49575* (2013.01); *H01L 24/48* (2013.01); *H01L 24/49* (2013.01); *H01L 2924/181* (2013.01)

(58) Field of Classification Search
CPC ... H01L 24/48; H01L 24/49; H01L 23/49568; H01L 23/3107; H01L 23/49503; H01L 23/49541; H01L 23/4952; H01L 23/49575; H01L 2924/181
See application file for complete search history.

(56) References Cited

U.S. PATENT DOCUMENTS

| | | | |
|---|---|---|---|
| 6,204,554 B1 * | 3/2001 | Ewer | H05K 3/341 257/E23.047 |
| 6,208,023 B1 | 3/2001 | Nakayama et al. | |
| 6,818,973 B1 * | 11/2004 | Foster | H01L 24/49 257/676 |
| 8,067,821 B1 * | 11/2011 | Choi | H01L 23/49541 257/667 |
| 8,575,742 B1 * | 11/2013 | Kim | H01L 23/49541 257/730 |
| 8,598,693 B2 * | 12/2013 | Nishikawa | H01L 21/565 257/676 |

(Continued)

FOREIGN PATENT DOCUMENTS

JP    H11-103003 A    4/1999

*Primary Examiner* — Alonzo Chambliss
(74) *Attorney, Agent, or Firm* — Studebaker & Brackett PC

(57) ABSTRACT

A semiconductor package includes: a plurality of die pads; a plurality of semiconductor chips provided on the plurality of die pads respectively; a plurality of lead terminals connected to the plurality of semiconductor chips respectively; and a package sealing the plurality of die pads, the plurality of semiconductor chips, and the plurality of lead terminals, the plurality of die pads and the plurality of lead terminals are exposed from a lower surface of the package, and on the lower surface of the package, grooves are provided among the die pads adjacent to one another and among the lead terminals adjacent to one another.

8 Claims, 8 Drawing Sheets

(56) References Cited

U.S. PATENT DOCUMENTS

2010/0001382 A1* 1/2010 Udompanyavit ..... H01L 23/495
                                                    438/123
2014/0217602 A1* 8/2014 Yoshino ............ H01L 23/49548
                                                    257/773
2015/0214199 A1* 7/2015 Kim ................. H01L 23/49575
                                                    438/107

* cited by examiner

SEMICONDUCTOR PACKAGE WITH PLURALITY OF GROOVES ON LOWER SURFACE

BACKGROUND OF THE INVENTION

Field

The present disclosure relates to a semiconductor package.

Background

There has been used a non-insulated type surface mounting module in which a die pad, on which a semiconductor chip is provided, is exposed on a package lower surface (see, for example. Japanese Laid-Open Patent Publication No. H11-103003).

SUMMARY

In the package of the related art, an inner end portion of a lead terminal is not exposed from the package lower surface in order to secure an insulation distance between the lead terminal and the die pad. Therefore, the lead terminal is not in contact with a heat radiation sheet. Heat generated in the lead terminal when an electric current is fed is radiated into the air. Accordingly, when the electric current is increased, the temperature of the lead terminal exceeds an allowable value, which hinders an increase in current density of the module. When a plurality of lead terminals adjacent to one another are exposed on the package lower surface, an insulation distance among the exposed lead terminals cannot be secured. In a 6-in-1 package including a plurality of die pads, an insulation distance among the exposed die pads cannot be secured. Accordingly, necessary insulation resistance cannot be secured.

The present disclosure has been made in order to solve the problems described above and an object of the present disclosure is to obtain a semiconductor package that can secure insulation resistance while improving heat radiation.

A semiconductor package according to the present disclosure includes: a plurality of die pads; a plurality of semiconductor chips provided on the plurality of die pads respectively; a plurality of lead terminals connected to the plurality of semiconductor chips respectively; and a package sealing the plurality of die pads, the plurality of semiconductor chips, and the plurality of lead terminals, the plurality of die pads and the plurality of lead terminals are exposed from a lower surface of the package, and on the lower surface of the package, grooves are provided among the die pads adjacent to one another and among the lead terminals adjacent to one another.

In the present disclosure, not only the plurality of die pads but also the plurality of lead terminals are exposed from the lower surface of the package. Accordingly, heat radiation can be improved. On the lower surface of the package, the grooves are provided among the die pads adjacent to one another and among the lead terminals adjacent to one another. Accordingly, a creepage distance among the exposed die pads and a creepage distance among the exposed lead terminals can be secured. Consequently, necessary insulation resistance can be secured.

Other and further objects, features and advantages of the invention will appear more fully from the following description.

DESCRIPTION OF EMBODIMENTS

A semiconductor package according to the embodiments of the present disclosure will be described with reference to the drawings. The same components will be denoted by the same symbols, and the repeated description thereof may be omitted.

First Embodiment

Figure 1:
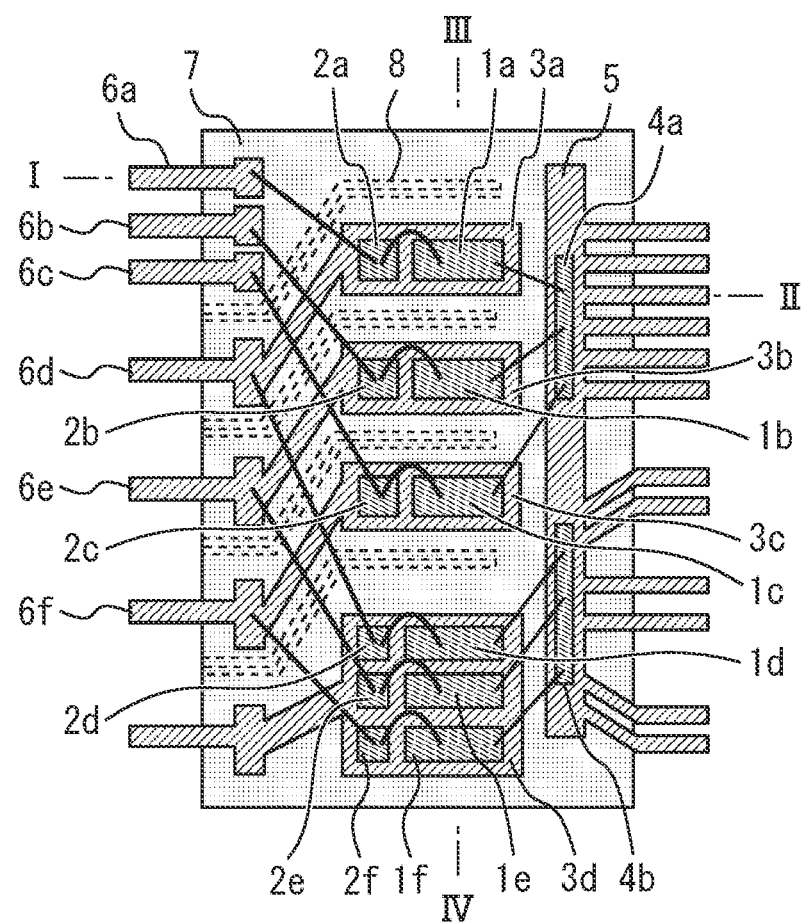
FIG. 1 is a top view showing the inside of a semiconductor package according to a first embodiment.
Figure 2:
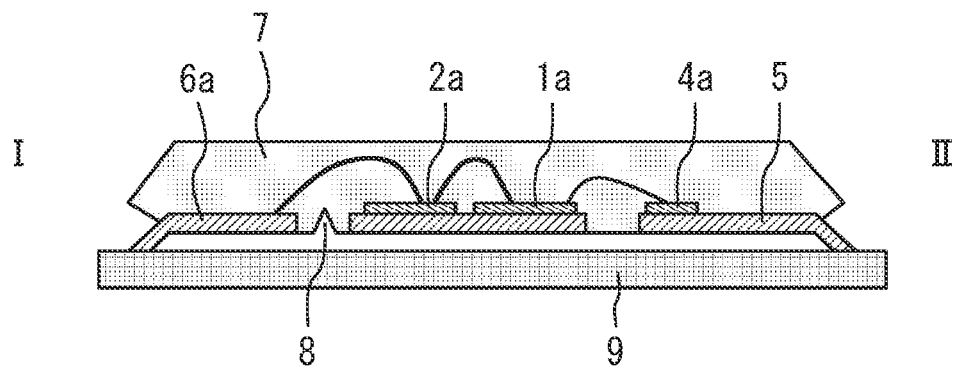
FIG. 2 is a sectional view showing the semiconductor package according to the first embodiment.
Figure 3:
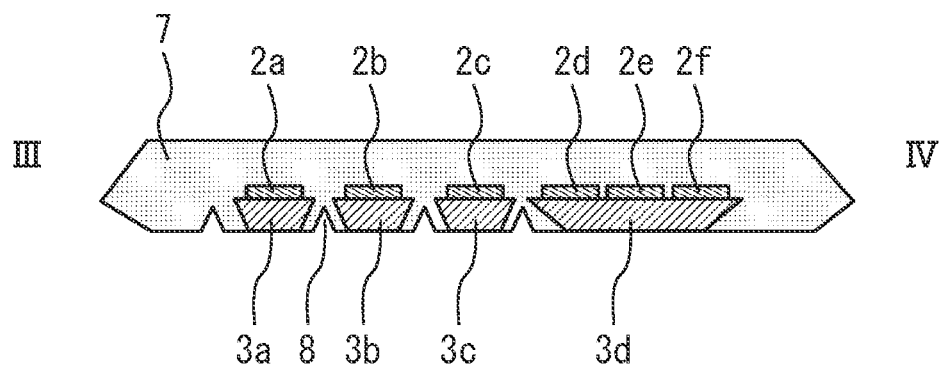
FIG. 3 is a sectional view showing the semiconductor package according to the first embodiment.
Figure 4:
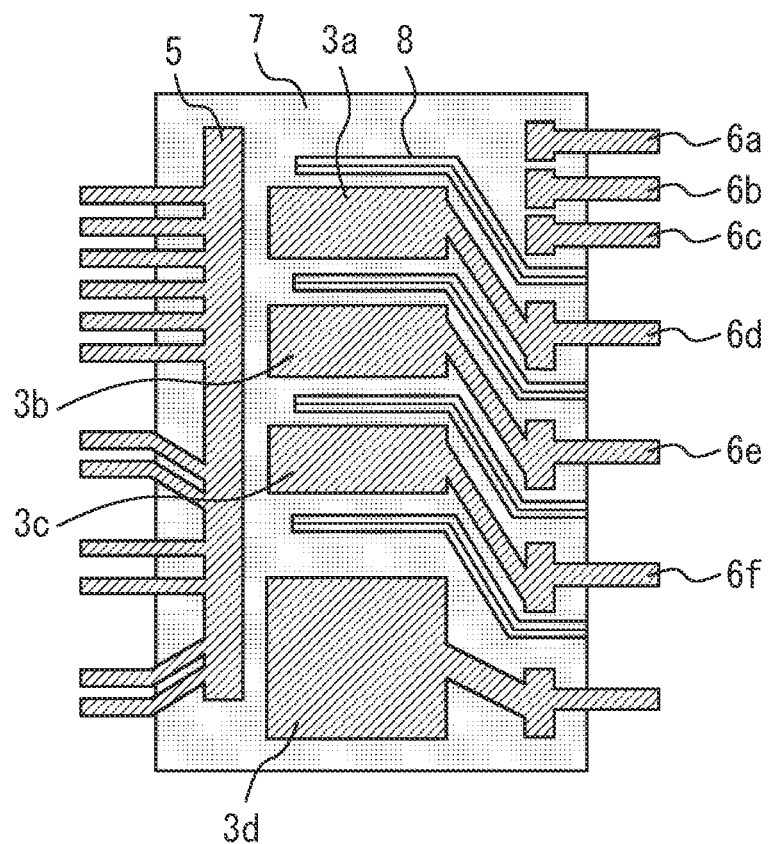
FIG. 4 is a bottom view showing the semiconductor package according to the first embodiment.

FIG. 1 is a top view showing the inside of a semiconductor package according to a first embodiment. FIGS. 2 and 3 are sectional views showing the semiconductor package according to the first embodiment. FIG. 4 is a bottom view showing the semiconductor package according to the first embodiment. FIG. 2 is a sectional view taken along I-II in FIG. 1. FIG. 3 is a sectional view taken along III-IV in FIG. 1. The semiconductor package is a 6-in-1 intelligent power module (IPM).

Semiconductor chips 1a to 1f are insulated gate bipolar transistors (IGBTs) that perform ON/OFF switching of a main current. Semiconductor chips 2a to 2f are free wheeling diodes (FWDs) that feed a reflux current at a switching interruption time.

The semiconductor chips 1a and 2a are provided on a die pad 3a. The semiconductor chips 1b and 2b are provided on a die pad 3b. The semiconductor chips 1c and 2c are provided on a die pad 3c. The semiconductor chips 1d to 1f and 2d to 2f are provided on a die pad 3d.

Upper surface electrodes of the semiconductor chips 1a to 1f are wire-connected to respective upper surface electrodes of the semiconductor chips 2a to 2f. Lower surface electrodes of the semiconductor chips 1a and 2a are connected to the die pad 3a. Lower surface electrodes of the semiconductor chips 1b and 2b are connected to the die pad 3b. Lower surface electrodes of the semiconductor chips 1c and 2c are connected to the die pad 3c. Lower surface electrodes of the semiconductor chips 1d to 1f and 2d to 2f are connected to the die pad 3d. A bonding material such as solder is used for the connection of the lower surface electrodes of the semiconductor chips 1a to 1f and 2a to 2f and the die pads 3a to 3d.

Control chips 4a and 4b are provided on a lead frame 5. Control electrodes of the semiconductor chips 1a to 1c are wire-connected to the control chip 4a. Control electrodes of the semiconductor chips 1d to 1f are wire-connected to the control chip 4b. The control chip 4a controls the semiconductor chips 1a to 1c. The control chip 4b controls the semiconductor chips 1d to 1f.

A plurality of lead terminals 6a to 6f are wire-connected to the respective upper surface electrodes of the plurality of semiconductor chips 2a to 2f. The lead terminals 6d to 6f are respectively coupled to the die pads 3a to 3c. The die pads 3a to 3d, the lead frame 5, and the lead terminals 6a to 6f are obtained by machining one metal thin plate into a wire shape.

A package 7 of epoxy resin or the like seals the semiconductor chips 1a to 1f and 2a to 2f, the die pads 3a to 3d, the lead frame 5, the lead terminals 6a to 6f, wires, and the like. Lower surfaces of the die pads 3a to 3d, the lead frame 5, and the lead terminals 6a to 6f are exposed from the lower surface of the package 7 and function as heat radiation surfaces that radiate heat. On the lower surface of the package 7, grooves 8 are provided among the die pads 3a to 3d adjacent to one another and among the lead terminals 6a to 6f adjacent to one another.

The semiconductor package having the configuration described above is mounted on a substrate 9. When the semiconductor package is mounted on the substrate 9, the lead frame 5 and the lead terminals 6a to 6f projecting from a side of the package 7 are each bent downward and connected to electrodes of the substrate 9.

In this embodiment, not only the die pads 3a to 3d but also the lead terminals 6a to 6f are exposed from the lower surface of the package 7. Accordingly, heat radiation can be improved. On the lower surface of the package 7, the grooves 8 are provided among the die pads 3a to 3d adjacent to one another and among the lead terminals 6a to 6f adjacent to one another. Accordingly, a creepage distance among the exposed die pads 3a to 3d and a creepage distance among the exposed lead terminals 6a to 6f can be secured. Consequently, necessary insulation resistance can be secured.

Second Embodiment

Figure 5:
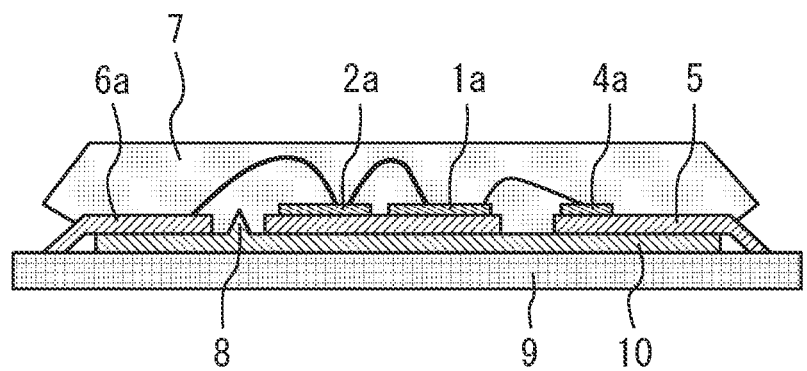
FIG. 5 is a sectional view showing a semiconductor package according to a second embodiment.
Figure 6:
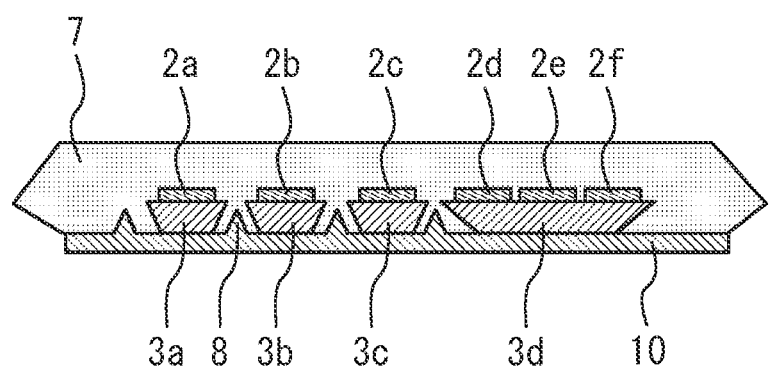
FIG. 6 is a sectional view showing a semiconductor package according to a second embodiment.

FIGS. 5 and 6 are sectional views showing a semiconductor package according to a second embodiment. Cross sections of FIGS. 5 and 6 respectively correspond to cross sections of FIGS. 2 and 3 in the first embodiment. In this embodiment, an insulating material 10 adheres to the lower surface of the package 7 and enters the grooves 8. The insulating material 10 has higher thermal conductivity than the material of the package 7 and is, for example, urethane having a Young's modulus of 500 [MPa] or less.

Spatial distances can be secured because the insulating material 10 enters the grooves 8 among the die pads 3a to 3d and among the lead terminals 6a to 6f. Therefore, the insulation resistance can be further improved. Heat of the die pads 3a to 3d and the lead terminals 6a to 6f is not only radiated into the air but also radiated to the substrate 9 via the insulating material 10. Therefore, heat radiation is improved. The other components and effects are the same as the components and the effects in the first embodiment.

Third Embodiment

Figure 7:
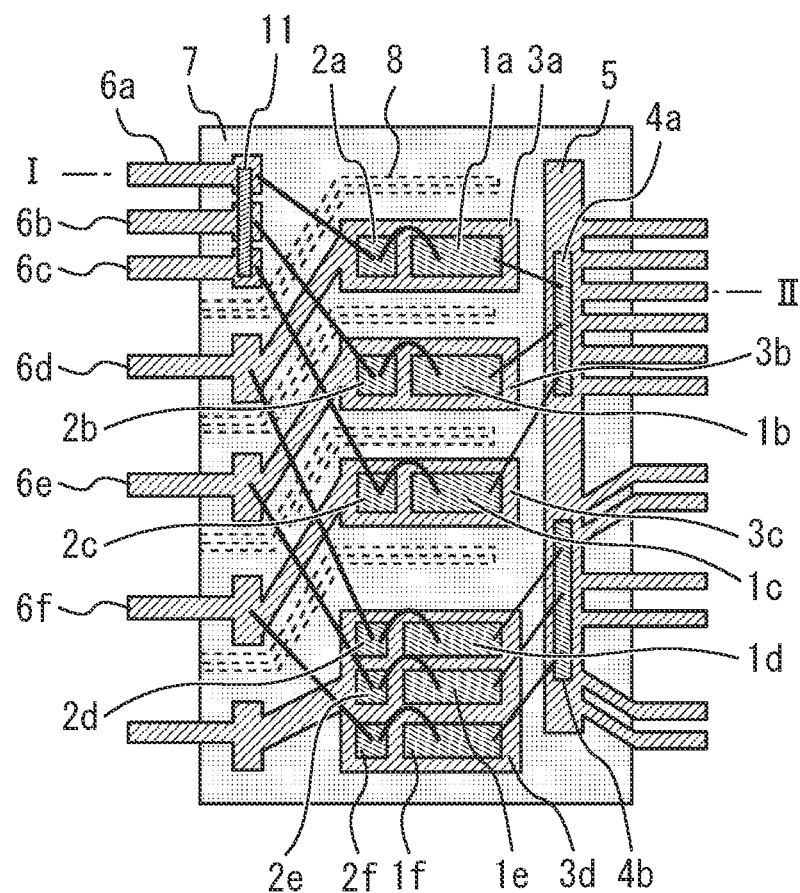
FIG. 7 is a top view showing the inside of a semiconductor package according to a third embodiment.
Figure 8:
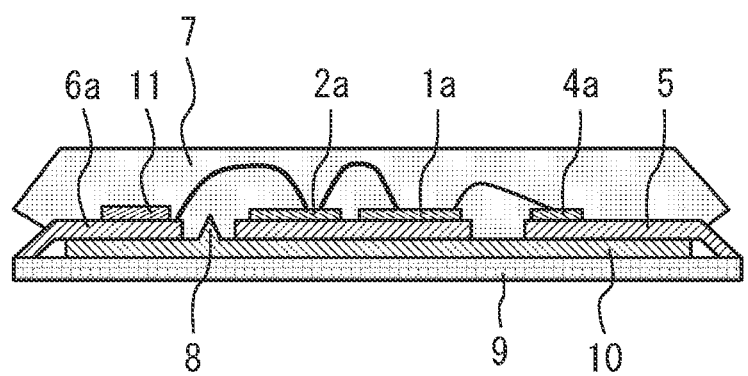
FIG. 8 is a sectional view showing the semiconductor package according to the third embodiment.

FIG. 7 is a top view showing the inside of a semiconductor package according to a third embodiment. FIG. 8 is a sectional view showing the semiconductor package according to the third embodiment. FIG. 8 is a sectional view taken along I-II in FIG. 7. In this embodiment, a shunt resistor 11 is provided on the lead terminals 6a to 6c. One end of the shunt resistor 11 is connected to the lead terminals 6a to 6c. The other end is grounded via an emitter terminal (not shown). The shunt resistor 11 is used to detect an electric current for protection against short circuit.

By incorporating the shunt resistor 11 in the package 7, a substrate mounting process and substrate mounting cost for mounting the shunt resistor 11 can be reduced. Since the lead terminals 6a to 6c, on which the shunt resistor 11 is provided, are exposed from the lower surface of the package 7 and adhere to the insulating material 10, the heat radiation of the shunt resistor 11 is improved.

Fourth Embodiment

Figure 9:
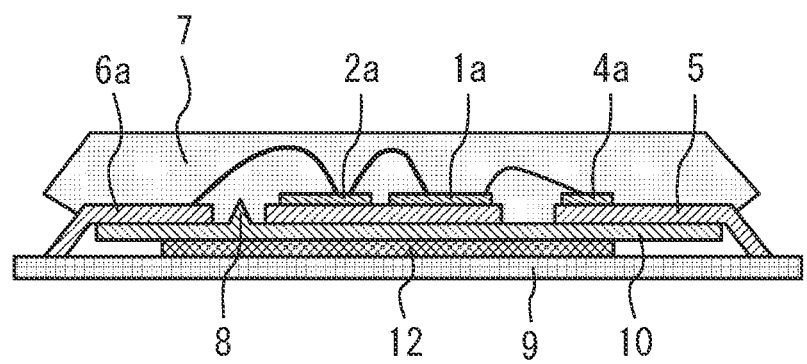
FIG. 9 is a sectional views showing a semiconductor package according to a fourth embodiment.
Figure 10:
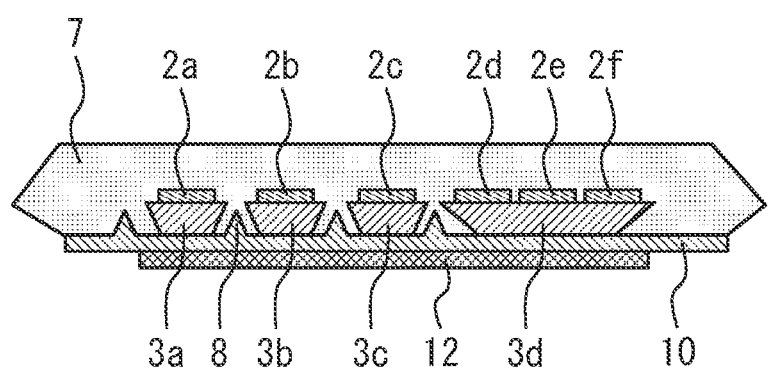
FIG. 10 is a sectional views showing a semiconductor package according to a fourth embodiment.

FIGS. 9 and 10 are sectional views showing a semiconductor package according to a fourth embodiment. Cross sections of FIGS. 9 and 10 respectively correspond to the cross sections of FIGS. 2 and 3 in the first embodiment. In this embodiment, a metal pattern 12 made of copper or the like is provided on the lower surface of the insulating material 10. Since heat radiation is enabled from the metal pattern 12 externally mounted in this way, the heat radiation from the die pads 3a to 3d and the lead terminals 6a to 6f is further improved. The other components and effects are the same as the components and the effects in the third embodiment.

Fifth Embodiment

Figure 11:
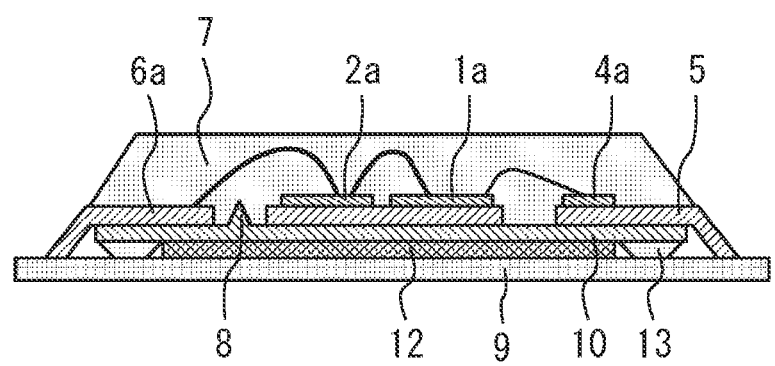
FIG. 11 is a sectional view showing a semiconductor package according to a fifth embodiment.
Figure 12:
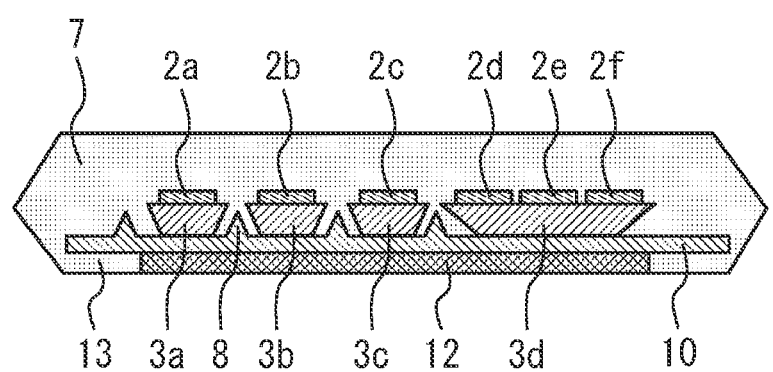
FIG. 12 is a sectional view showing a semiconductor package according to a fifth embodiment.
Figure 13:
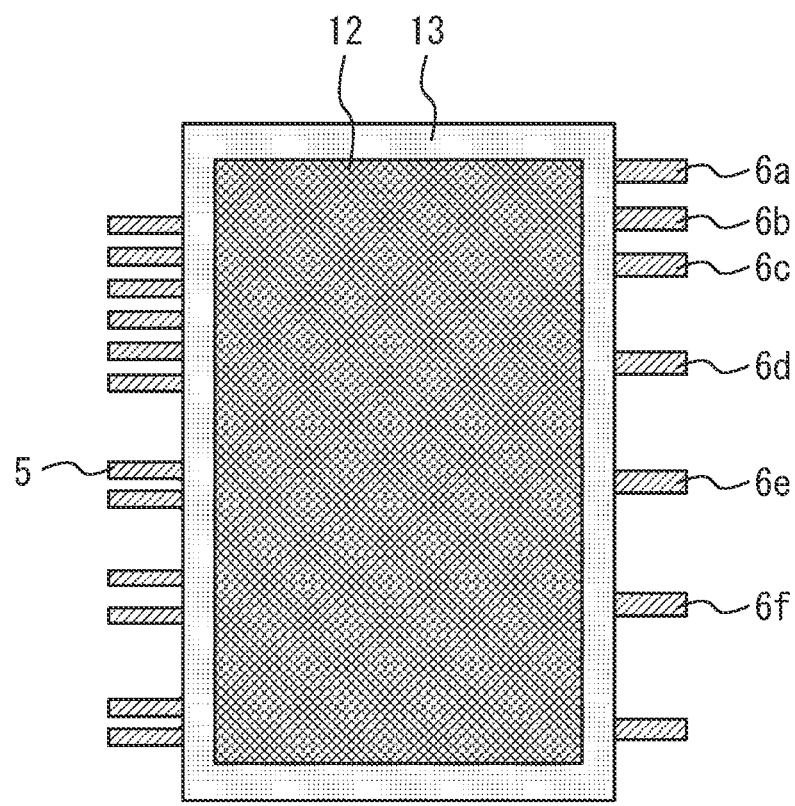
FIG. 13 is a bottom view showing the semiconductor package according to the fifth embodiment.

FIGS. 11 and 12 are sectional views showing a semiconductor package according to a fifth embodiment. FIG. 13 is a bottom view showing the semiconductor package according to the fifth embodiment. Cross sections of FIGS. 11 and 12 respectively correspond to the cross sections of FIGS. 2 and 3 in the first embodiment. In this embodiment, the insulating material 10 is sealed by resin 13 such as epoxy resin. The lower surface of the metal pattern 12 is exposed from the resin 13. The other components are the same as the components in the fourth embodiment.

The package 7 and the resin 13 form one package. By incorporating the insulating material 10 in the package in this way, a substrate mounting process and substrate mounting cost for mounting the semiconductor package on the substrate 9 can be reduced. The other effects are the same as the effects in the fourth embodiment. Note that, even when the insulating material 10 is sealed by the resin 13, it is necessary to provide the grooves 8 and cause the insulating material 10 to enter the grooves 8 in order to secure spatial distances among the die pads 3a to 3d and among the lead terminals 6a to 6f.

Sixth Embodiment

Figure 14:
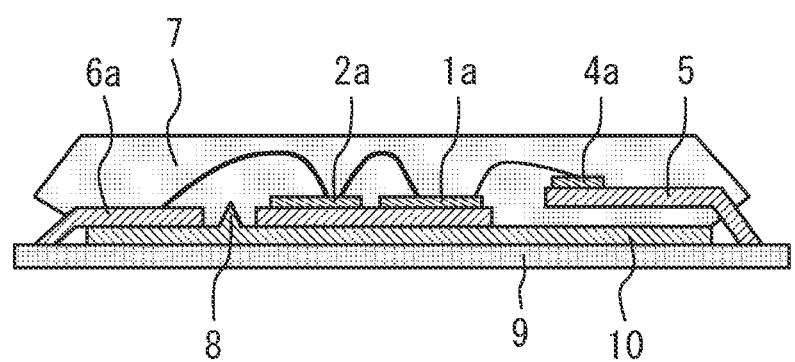
FIG. 14 is a sectional view showing a semiconductor package according to a sixth embodiment.
Figure 15:
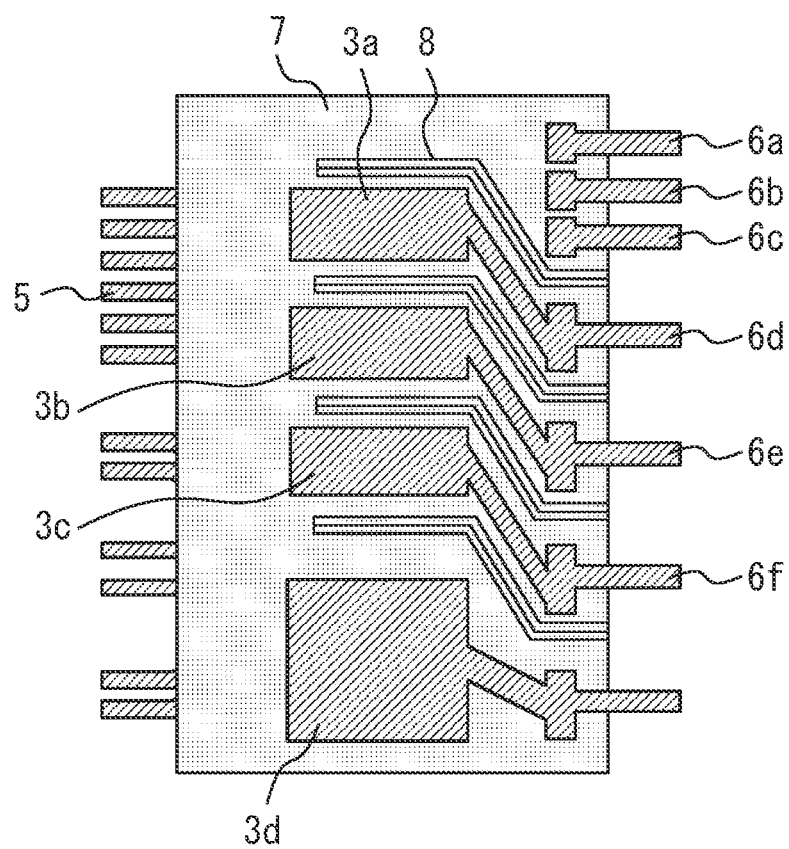
FIG. 15 is a bottom view showing the semiconductor package according to the sixth embodiment.

FIG. 14 is a sectional view showing a semiconductor package according to a sixth embodiment. FIG. 15 is a bottom view showing the semiconductor package according to the sixth embodiment. In this embodiment, the lead frame 5, on which the control chips 4a and 4b having a small heat value are provided, is not exposed from the lower surface of the package 7. That is, only the die pads 3a to 3d, on which the semiconductor chips 1a to 1f and 2a to 2f to be main heat generation sources are provided, and the plurality of lead terminals 6a to 6f are exposed from the lower surface of the package 7. The other components are the same as the components in the second embodiment. In this case, heat radiation can be improved as in the second embodiment.

The semiconductor chips 1a to 1f and 2a to 2f are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor package in which the semiconductor chip is incorporated. Further, since the semiconductor chip has a high heat resistance, a radiation fin of a heatsink can be miniaturized and a water-cooled part can be air-cooled, which leads to further miniaturization of the semiconductor package. Further, since the semiconductor chip has a low power loss and a high efficiency, a highly efficient semiconductor package can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-30287, filed on Feb. 26, 2021 including specification, claims, drawings and summary, on which the convention priority of the present application is based, is incorporated herein by reference in its entirety.

The invention claimed is:

1. A semiconductor package comprising:
a plurality of die pads;
a plurality of semiconductor chips provided on the plurality of die pads respectively;
a plurality of lead terminals connected to the plurality of semiconductor chips respectively; and
a package sealing the plurality of die pads, the plurality of semiconductor chips, and the plurality of lead terminals,
the plurality of die pads and the plurality of lead terminals are exposed from a lower surface of the package, and
on the lower surface of the package, grooves are provided among the die pads adjacent to one another and among the lead terminals adjacent to one another, and the grooves are respectively spaced from the lead terminals and the die pads in a top view from one end to another end of each groove.

2. The semiconductor package according to claim 1, wherein inner end portions of the plurality of lead terminals are wire-connected to the plurality of semiconductor chips respectively and exposed from the lower surface of the package, and
the plurality of die pads and the plurality of lead terminals are flush with each other on the lower surface of the package.

3. The semiconductor package according to claim 1, further comprising a shunt resistor provided on and connected to one of the plurality of lead terminals.

4. The semiconductor package according to claim 1, further comprising:
a lead frame; and
a control chip provided on the lead frame and controlling the plurality of semiconductor chips,
wherein the lead frame is not exposed from the lower surface of the package.

5. The semiconductor package according to claim 1, wherein the plurality of semiconductor chips are made of a wide-band-gap semiconductor.

6. A semiconductor package comprising:
a plurality of die pads;
a plurality of semiconductor chips provided on the plurality of die pads respectively;
a plurality of lead terminals connected to the plurality of semiconductor chips respectively;
a package sealing the plurality of die pads, the plurality of semiconductor chips, and the plurality of lead terminals; and
an insulating material adhering to the lower surface of the package, entering the grooves, and having higher thermal conductivity than the package,
the plurality of die pads and the plurality of lead terminals are exposed from a lower surface of the package, and
on the lower surface of the package, grooves are provided among the die pads adjacent to one another and among the lead terminals adjacent to one another.

7. The semiconductor package according to claim 6, further comprising a metal pattern provided on a lower surface of the insulating material.

8. The semiconductor package according to claim 6, further comprising resin sealing the insulating material.

* * * * *